US012813028B2

(12) United States Patent
Zitzlsperger et al.

(10) Patent No.: US 12,813,028 B2
(45) Date of Patent: Nov. 24, 2026

(54) OPTOELECTRONIC SEMICONDUCTOR COMPONENT AND PRODUCTION METHOD

(71) Applicant: ams-OSRAM International GmbH, Regensburg (DE)

(72) Inventors: Michael Zitzlsperger, Regensburg (DE); Rainer Huber, Bad Abbach (DE); Thomas Klafta, Burglengenfeld (DE); Stephan Janka, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 243 days.

(21) Appl. No.: 18/575,748

(22) PCT Filed: Jun. 30, 2022

(86) PCT No.: PCT/EP2022/068083
§ 371 (c)(1),
(2) Date: Dec. 29, 2023

(87) PCT Pub. No.: WO2023/280674
PCT Pub. Date: Jan. 12, 2023

(65) Prior Publication Data
US 2024/0363808 A1 Oct. 31, 2024

(30) Foreign Application Priority Data
Jul. 6, 2021 (DE) ......................... 102021117414.7

(51) Int. Cl.
*H10H 20/85* (2025.01)
*H10H 20/01* (2025.01)
(Continued)

(52) U.S. Cl.
CPC ...... *H10H 20/8506* (2025.01); *H10H 20/857* (2025.01); *H10W 90/00* (2026.01); *H10H 20/0364* (2025.01)

(58) Field of Classification Search
CPC ............. H10H 20/857; H10H 20/8506; H10H 29/857; H10H 29/49
See application file for complete search history.

(56) References Cited

U.S. PATENT DOCUMENTS

2004/0238923 A1 12/2004 Lee et al.
2013/0113015 A1* 5/2013 Kimura .............. H10H 20/8582 438/22

(Continued)

FOREIGN PATENT DOCUMENTS

CN 105103315 A 11/2015
CN 107799484 A 3/2018

(Continued)

OTHER PUBLICATIONS

Andy Pai, ESEC 2007 Die Bond, https://www.youtube.com/watch?v=n2w1QpxUqhk (Year: 2007).*

(Continued)

*Primary Examiner* — Vincent Wall
(74) *Attorney, Agent, or Firm* — Slater Matsil, LLP

(57) ABSTRACT

In an embodiment an optoelectronic semiconductor device includes a carrier comprising a mounting side and an attachment side opposite the mounting side, a plurality of separate, metallic lead frame parts and a potting body mechanically holding together the lead frame parts, and a plurality of optoelectronic semiconductor chips mounted on the mounting side, wherein the lead frame parts project beyond the potting body at the mounting side, wherein at least some of the lead frame parts have a double-layered design so that the lead frame parts together form a support layer on the attachment side and a mounting layer on the mounting side,
(Continued)

wherein the support layer is embedded in the potting body and the mounting layer extends at least partially onto the potting body.

18 Claims, 7 Drawing Sheets

(51) Int. Cl.
*H10H 20/857* (2025.01)
*H10W 90/00* (2026.01)

(56) References Cited

U.S. PATENT DOCUMENTS

| | | | | |
|---|---|---|---|---|
| 2018/0040780 | A1 | 2/2018 | Hirasawa et al. | |
| 2020/0212276 | A1 * | 7/2020 | Lim | H10H 20/8506 |
| 2022/0293836 | A1 | 9/2022 | Schwarz | |
| 2023/0268477 | A1 | 8/2023 | Zitzlsperger | |

FOREIGN PATENT DOCUMENTS

| | | | |
|---|---|---|---|
| CN | 111727512 | A | 9/2020 |
| DE | 102020004863 | A1 | 2/2022 |
| EP | 3261136 | A1 | 12/2017 |
| JP | 2017212290 | A | 11/2017 |
| WO | 2021105453 | A1 | 6/2021 |

OTHER PUBLICATIONS

Watch Learn N' Play, Semiconductor Packaging—Assembly Process Flow, https://www.youtube.com/watch?v=DiFovfCtvgw (Year: 2022).*

* cited by examiner

OPTOELECTRONIC SEMICONDUCTOR COMPONENT AND PRODUCTION METHOD

CROSS-REFERENCE TO RELATED APPLICATIONS

This patent application is a national phase filing under section 371 of PCT/EP2022/068083, filed Jun. 30, 2022, which claims the priority of German patent application 102021117414.7, filed Jul. 6, 2021, each of which is incorporated herein by reference in its entirety.

TECHNICAL FIELD

An optoelectronic semiconductor device is provided. In addition, a manufacturing method for such an optoelectronic semiconductor devices is provided.

BACKGROUND

Document DE 10 2020 004 863 A1 refers to optoelectronic semiconductor devices.

SUMMARY

Embodiments provide an optoelectronic semiconductor device in which semiconductor chips can be efficiently electrically connected.

According to at least one embodiment, the optoelectronic semiconductor device comprises a carrier. The carrier is preferably the component mechanically supporting and carrying the semiconductor device. In particular, the carrier is mechanically rigid so that the carrier, and thus the semiconductor device, does not deform or does not deform significantly during intended use of the semiconductor device.

According to at least one embodiment, the semiconductor device comprises several optoelectronic semiconductor chips. The optoelectronic semiconductor chips are, for example, light-emitting diodes, LEDs for short, or laser diodes, LDs for short. Likewise, at least one of the optoelectronic semiconductor chips may be a detector, such as a photodiode. All semiconductor chips may be identical in construction, or different types of optoelectronic semiconductor chips may be combined, for example, several LEDs with different emission colors and optionally additionally at least one photodiode.

According to at least one embodiment, the at least one optoelectronic semiconductor chip comprises a semiconductor layer sequence, for example, based on $Al_nIn_{1-n-m}Ga_mN$ or $Al_nIn_{1-n-m}Ga_mP$ or $Al_nIn_{1-n-m}Ga_mAs$. The semiconductor layer sequence preferably comprises at least one active layer configured to generate the radiation.

According to at least one embodiment, the optoelectronic semiconductor chips are attached to a mounting side of the carrier, for example, soldered or sintered or electrically conductively glued on or also attached by means of friction welding. The mounting side occupies either only a part or an entire main side of the carrier, this main side being opposite an attachment side of the carrier. The attachment side may be flat.

According to at least one embodiment, all optoelectronic semiconductor chips or all of the light-emitting or part of the optoelectronic semiconductor chips are flip chips. That means in particular that electrical contact areas are located on a single main side of the semiconductor chip in question. Preferably, each of the optoelectronic semiconductor chips is mounted on two or more than two of the lead frame parts and is electrically contacted by means of these lead frame parts.

According to at least one embodiment, the attachment side is configured for surface mounting. This means that the semiconductor device can be attached to an external part, such as a printed circuit board, using surface mount technology, or SMT for short.

According to at least one embodiment, the carrier is composed of several lead frame parts and of at least one potting body. The lead frame parts, also referred to as lead frames, are preferably separate metallic parts. For example, the lead frame parts are made of copper or a copper alloy, and surfaces of the lead frame parts that are not covered by the potting body may be provided with coatings. Such coatings include, for example, Ag, Al, Au, Cr, Ni, Pd and/or Pt.

According to at least one embodiment, the potting body holds the lead frame parts together mechanically. This means in particular that without the potting body the lead frame parts would not have a fixed mechanical connection to each other. For this purpose, the potting body preferably extends in part on side surfaces of the lead frame parts, the side surfaces being oriented transversely to the mounting side and/or to the attachment side.

In at least one embodiment, the optoelectronic semiconductor device comprises a carrier and a plurality of optoelectronic semiconductor chips mounted on a mounting side of the carrier, wherein

- the carrier comprises a plurality of separate, metallic lead frame parts and a potting body, and the potting body holds the lead frame parts together,
- an attachment side of the carrier is opposite the mounting side and the attachment side is configured for surface mounting of the semiconductor device,
- the lead frame parts project beyond the potting body at the mounting side, and
- the optoelectronic semiconductor chips are flip chips, so that each of the optoelectronic semiconductor chips is mounted on at least two of the lead frame parts and is electrically contacted by means of these lead frame parts. In particular, at least some of the lead frame parts are configured in two layers, such that these lead frame parts comprise a support layer on the attachment side and a mounting layer on the mounting side, and the support layer is embedded in the potting body and the mounting layer extends at least partially onto the potting body, and wherein further at least one of the following two possibilities is realized: the support layer is thicker than the mounting layer by at least a factor of 2 and, as seen in plan view of the mounting side, the support layer is partially exposed; and/or the support layer is flush with the potting body in the direction towards the mounting side and towards the attachment side, so that the potting body is as thick as the support layer.

In at least one embodiment, the optoelectronic semiconductor device comprises a carrier and a plurality of optoelectronic semiconductor chips mounted on a mounting side of the carrier, wherein

- the carrier comprises a plurality of separate, metallic lead frame parts and a potting body, and the potting body holds the lead frame parts together,
- an attachment side of the carrier is opposite the mounting side and the mounting side is configured for surface mounting of the semiconductor device, the lead frame parts project beyond the potting body at the mounting side, and the optoelectronic semiconductor chips are flip chips, so that each of the optoelectronic semiconductor chips is mounted on at least two of the lead frame parts and is electrically contacted by means of these lead frame parts. In particular, at least some of the semiconductor chips are connected to form an electrical series circuit, and the lead frame parts for the semiconductor chips of the electrical series circuit are arranged along two rows and these rows only partially interlock with one another, so that lead frame parts of the two rows are present alternately along an arrangement line of the semiconductor chips of the electrical series circuit.

In connection with the semiconductor device described herein, design elements are specified for devices with flip chips, particularly on a lead frame basis or PCB basis, where PCB stands for printed circuit board.

The semiconductor device described herein can be miniaturized compared to other designs of optoelectronic semiconductor devices and can be used, for example, in automotive, consumer electronics or industrial applications. Furthermore, the semiconductor devices described herein offer improved thermal connectivity to an external mounting platform, such as a printed circuit board, and exhibit higher cycling stability with respect to thermal stress.

For electrical and thermal contacting in the semiconductor device described here, a flip chip is soldered or bonded to a carrier at its contact points, which in the case of an LED are usually two contact points. There are two aspects to be considered, which can be solved differently—depending on the technology:

a) Different thermal expansion of flip chip and carrier lead frame to stress on a contact area and on the semiconductor chip. This can lead to a break of the electrical connection or the semiconductor chip during temperature cycles.

b) A contact to the carrier is not full-surface, but only occurs at the contact points. This restricts the thermal connection and only relatively high thermal resistances can be achieved.

Design elements for a lead frame-based carrier are proposed here, which are not yet possible in the standard QFN design without major limitations and which represent significant improvements in terms of performance and cost with respect to aspects a) and b) above.

As a rule, PCB-based or ceramic-based substrates are used as substrates for flip chips. In both cases, to a certain extent, rewiring of the chip mounting side and solder side is possible. The disadvantages of ceramic substrates in particular are the high costs and poor solder joint reliability for larger components, such as multichip LEDs.

The alternative use of QFN-based concepts for substrates would be more favorable in many cases, accompanied by lower costs and reduced thermal resistance, but has so far mostly not been reasonably considered due to the limited design possibilities. The most relevant design limitations are:

A) The minimum structure sizes in conventional QFN lead frames are too large. For small flip chips, a distance between solder joints is significantly less than 100 μm. Since the minimum structure size for lead frames is usually about ⅔ of a lead frame thickness, only very thin lead frames can be considered for flip chips, but these are mechanically very sensitive after molding with a potting body, which leads to difficult handling in further manufacturing steps.

B) No or only small floating areas of the lead frame are possible as chip contact area. The lead frame is encapsulated with a potting material, such as an epoxy, in an injection molding process, such as transfer molding. In this process, only areas with full material thickness, that is, not semi-etched areas, can be sealed well; other areas float and are then covered by potting material. As a result, the chip contact areas in particular must lie on areas of full material thickness.

C) There is relatively high mechanical stress on the flip chip and the interconnect layer between chip and carrier during thermal cycling. The contacts of the flip chip are located on various solid metal pieces of the carrier, which are usually soldered directly under the chip on a printed circuit board. The different thermal expansion coefficients of the chip and the carrier result in large forces that can damage the component.

In the semiconductor devices described here, construction elements that can also be referred to as Routable QFN, or Rt-QFN for short, are used in particular to manufacture small optoelectronic devices on lead frame-based carriers, especially without exposed copper on package side surfaces. Thus, in the present case, Rt-QFN lead frame-based carriers can be used for the surface-mount semiconductor devices without the metallic lead frame parts being interconnected by tie bars. The functional lead frame parts, such as anode pads and cathode pads, of the individual devices are insulated and embedded in the Rt-QFN molded layer, that is, in the potting body. For the device separated out of the associated panel, all exposed metal surfaces can be avoided.

With an Rt-QFN panel as substrate, the above problems can at least be largely avoided:

to A): The upper metal structures on the mounting side and the lower metal structures on the attachment side are patterned in two separate manufacturing steps. The minimum structure sizes, especially on the mounting side, are thus sufficiently small to allow flip chip mounting.

to B): The manufacturing process of an Rt-QFN substrate allows large-area and finely structured metallic areas floating on a dielectric, such as an epoxy, as a potting body. These areas can be laterally far separated from areas of full material thickness of the lead frame.

to C): The areas floating on the dielectric are not laterally surrounded by the dielectric, that is, these areas can move a little at relatively low counterforce.

The use of an Rt-QFN lead frame, as described herein, is advantageous compared to a PCB substrate, particularly because:

it is less expensive, and if offers lower thermal resistance; with a PCB substrate, thermal contact is usually only made via many small vias, which have a low areal density and are comparatively expensive to manufacture.

The use of an Rt-QFN lead frame is advantageous compared to a ceramic substrate, in particular because:

being considerably less expensive, and it offers increased reliability, since ceramic substrates exhibit thermal expansion that is unfavorable for PCBs and semiconductor chips and are also comparatively rigid.

The use of an Rt QFN lead frame is advantageous compared to a conventional QFN substrate, especially because:

- rewiring is possible,
- floating areas on the mounting side are possible,
- smaller structure sizes can be achieved that are small enough for flip chips, and
- structures for mechanical relief of the flip chips are possible.

According to at least one embodiment, the potting body protrudes beyond the lead frame parts on all sides, as seen in plan view on the attachment side. That is, seen in plan view, the potting body protrudes over the lead frame parts all around. Thus, outer side surfaces of the semiconductor device can be formed by the potting body, and the lead frame parts do not extend to the outer side surfaces.

Preferably, the lead frame parts extend at least as close to the attachment side as the potting body. This means that the potting body can project beyond the lead frame parts on the attachment side or, particularly preferably, the lead frame parts are flush with the potting body on the attachment side. The term "flush" may be assigned a tolerance of at most 20 μm or of at most 10 μm or of at most 2 μm.

According to at least one embodiment, the lead frame parts on or directly on the attachment side are directly covered by the potting body on all sides in the direction parallel to the attachment side. This means, for example, that viewed from the side of the semiconductor device on the attachment side, the lead frame parts are not exposed but are covered by the potting body. In the lateral direction, that is, in the direction parallel to the attachment side, the lead frame parts close to the attachment side are thus in physical contact with the potting body all around.

According to at least one embodiment, the lead frame parts each have a thickness of at most 0.5 mm or of at most 0.2 mm or of at most 0.1 mm or of at most 50 μm. A thickness of the potting body is, for example, at most 90% or at most 80% of the thickness of the lead frame parts.

According to at least one embodiment, the attachment side is formed exclusively by the lead frame parts. This means that the potting body ends at a distance from the attachment side. For example, the lead frame parts project beyond the potting body towards the attachment side by at least 10 μm or by at least 5 μm.

According to at least one embodiment, the carrier is plane. For example, the mounting side and the attachment side are then each flat surfaces oriented parallel to each other. Alternatively or additionally, the carrier may be flat. This means, for example, that in the direction parallel to the attachment side, a lateral extent of the carrier is at least three times or at least five times or at least ten times greater than a thickness of the carrier in the direction perpendicular to the attachment side. If the attachment side is rectangular, the lateral extension is equal to a diagonal length of the attachment side.

According to at least one embodiment, the potting body forms a cavity in which the at least one optoelectronic semiconductor chip is mounted. In this case, the potting body preferably projects beyond the at least one optoelectronic semiconductor chip in the direction away from the mounting side. If several of the semiconductor chips are present, a separate cavity may be provided for each semiconductor chip, or groups of semiconductor chips may be distributed over several cavities, or all semiconductor chips may be located in a common cavity. The cavity or some of the cavities or all of the cavities are preferably open in the direction away from the mounting side, so that the at least one associated semiconductor chip is not covered by the potting body.

In this case, the potting body may be composed of several parts, or there may be several potting bodies. For example, a first potting body is used to join the lead frame parts together; this potting body can be formed plane-parallel or substantially plane-parallel. A subsequently applied second potting body may then form the cavity. Alternatively, the potting body is of one-piece or single-component design.

According to at least one embodiment, at least some of the lead frame parts are designed with two layers. Taken together, these lead frame parts then form a support layer on the attachment side and a mounting layer on the mounting side. The support layer thus comprises all subareas of the relevant lead frame parts on the attachment side; the support layer is thus not a coherent metal body. The same applies to the mounting layer.

According to at least one embodiment, the support layer is embedded in the potting body, in particular in the direction parallel to the attachment side. Alternatively or additionally, the mounting layer extends at least partially onto the potting body. That is, the support layer and the mounting layer are not congruent. The support layer can project laterally beyond the mounting layer in places, and likewise the mounting layer can project laterally beyond the support layer in places.

According to at least one embodiment, the support layer is thicker than the mounting layer by at least a factor of 1.5 or by at least a factor of 2 or by at least a factor of 3. It is possible that the mounting layer and the support layer can each be described by plane-parallel layers.

According to at least one embodiment, viewed from above on the mounting side, the support layer is partially exposed. That is, the support layer is only incompletely covered by the mounting layer.

According to at least one embodiment, the support layer is flush with the potting body in the direction towards the mounting side and/or towards the attachment side. That is, the potting body can be as thick as the support layer. In particular, an average thickness of the potting body is equal to an average thickness of the support layer.

According to at least one embodiment, the semiconductor chips are only attached to the mounting layer. That is, the semiconductor chips then do not touch the support layer.

According to at least one embodiment, seen in top view on the mounting side, the semiconductor chips each extend to at most 20% or to at most 10% or to at most 5% on the support layer. In other words, the semiconductor chips then extend predominantly only to the potting body and to the mounting layer. Seen in plan view, the semiconductor chips can lie completely laterally displaced relative to the lead frame areas attributable to the support layer.

According to at least one embodiment, in at least one cross-section perpendicular to the mounting side and viewed through at least two of the semiconductor chips, at least some contiguous partial areas of the mounting layer are spaced apart from the support layer. That is, as seen in plan view of the mounting side, the lead frame regions attributable to the mounting layer are in part completely laterally displaced relative to the lead frame regions attributable to the support layer.

According to at least one embodiment, a minimum distance between adjacent lead frame parts at the mounting side is at most 70 μm or at most 50 μm or at most 30 μm or at most 20 μm. Alternatively or additionally, a gap between adjacent lead frame parts is at most 80% or at most 55% of a difference of a thickness of the lead frame parts and a thickness of the potting body between the adjacent lead frame parts; thus, this difference is equal to a thickness of the mounting layer. This is made possible in particular by the half-etching of the lead frame parts.

According to at least one embodiment, some or all of the semiconductor chips are connected to form one or more electrical series circuits.

According to at least one embodiment, some or all of the semiconductor chips are connected to form one or more electrical parallel circuits.

It is possible that at least one electrical series circuit is combined with at least one electrical parallel circuit in the semiconductor device. Alternatively, there is only a single electrical series circuit or only a single electrical parallel circuit of the semiconductor chips.

According to at least one embodiment, the semiconductor chips of the at least one electrical series circuit and/or the at least one electrical parallel circuit are arranged along an arrangement line, for example, a straight line section or also a bent curve. It is possible that all semiconductor chips are arranged along the straight line section.

According to at least one embodiment, the arrangement line, seen in plan view on the mounting side, forms a mirror symmetry axis for the lead frame parts, in particular for the lead frame parts of the respective at least one electrical series circuit and/or the at least one electrical parallel circuit.

According to at least one embodiment, seen in top view on the mounting side, some or all of the lead frame parts widen in direction away from the arrangement line and/or in direction away from the mirror symmetry axis. That is, the lead frame parts are shaped, for example, like symmetrical or asymmetrical trapezoids, optionally with additional rectangles attached to such trapezoids, as seen in plan view on the mounting side.

According to at least one embodiment, the lead frame parts for the semiconductor chips, in particular of the at least one electrical series circuit, are arranged along two rows. Preferably, these rows partially interlock with each other so that lead frame parts of the two rows are alternately present along an arrangement line of the semiconductor chips of the respective electrical series circuit. That is, along the arrangement line a lead frame part of a first row is followed by a lead frame part of a second row and so on. This applies in particular with regard to the mounting layer.

According to at least one embodiment, the lead frame parts for the at least one electrical parallel circuit are each comb-shaped, such that each of these lead frame parts has a plurality of prongs. These lead frame parts may interlock with each other. In other words, the respective lead frame parts may represent two combs pushed into each other, as seen in plan view on the mounting side. This is particularly true with respect to the mounting position.

According to at least one embodiment, the prongs of the lead frame parts for the respective electrical parallel circuit or series circuit each contact exactly one of the semiconductor chips. Alternatively, the prongs of the lead frame parts for the respective electrical parallel circuit or series circuit make contact with exactly two of the semiconductor chips in each case.

According to at least one embodiment, the optoelectronic semiconductor device further comprises a housing ring, which is, for example, made of a plastic. The housing ring is attached to the mounting side. Optionally, the housing ring forms a well in which the semiconductor chips are located. Alternatively, a multi-component potting body, for example produced by multi-component molding, may be present in the semiconductor device to form the well.

According to at least one embodiment, the optoelectronic semiconductor device further comprises at least one encapsulation body. Preferably, the encapsulation body is at least partially transparent to radiation generated by the at least one optoelectronic semiconductor chip during operation. For example, the encapsulation body is a seal against environmental influences and/or forms a conversion medium body for a wavelength change of the radiation generated by the associated semiconductor chip in operation. There may be several different encapsulant bodies, for example, with different phosphors or optical filter materials. It is possible that the encapsulation body completely covers the at least one optoelectronic semiconductor chip.

According to at least one embodiment, the semiconductor device comprises one or more further lead frame parts. Preferably, the at least one further lead frame part is made of a metal, in particular of copper or of a copper alloy. The at least one further lead frame part is thinner than the carrier. In particular, the at least one further lead frame part penetrates the potting body at most partially. For example, the at least one further lead frame part has a thickness equal to the total thickness of the carrier minus the thickness of the potting body. It is possible that the at least one further lead frame part is exclusively attributable to the mounting layer and does not extend into the support layer.

According to at least one embodiment, the at least one further lead frame part is made of the same material as the lead frame parts. In particular, the lead frame parts and the at least one further lead frame part are produced from the same metal sheet, for example, by means of etching.

According to at least one embodiment, the at least one further lead frame part is electrically non-functional. For example, the at least one further lead frame part is then electrically isolated from the lead frame parts. In this case, the at least one further lead frame part is, for example, a stop edge for an optical body, such as a lens, or a stop edge for a potting body, in particular when creating the body in question.

According to at least one embodiment, the at least one further lead frame part has an electrical function. For example, the at least one further lead frame part then forms an electrical conductor path, for example to electrically interconnect a plurality of the semiconductor chips.

Several different types of further lead frame parts may be present in the semiconductor device, for example, at least one electrically functionless further lead frame part and at least one electrically functionalized further lead frame part.

According to at least one embodiment, the encapsulation body has a reflectivity of at most 50% or at most 20% for radiation generated by the semiconductor chip during operation of the semiconductor chip. Alternatively or additionally, the reflectivity is at least 0.5% or at least 1% or at least 2%.

According to at least one embodiment, the carrier further comprises one or more metallizations. The preferably multiple metallizations may together partially form the mounting side and/or the attachment side. The at least one optoelectronic semiconductor chip may be directly deposited on one or more of the metallizations, such that at most one mounting means is located between the semiconductor chip and the at least one associated metallization.

Optionally, in addition to the preferably multiple metallizations on the mounting side, at least one further metal coating is present on the attachment side, wherein the at least one further metal coating can also extend directly onto the potting body and can originate from an associated lead frame part.

In addition, a method of manufacturing optoelectronic semiconductor devices as described in connection with one or more of the above embodiments is provided. Features of the method are therefore also disclosed for the optoelectronic semiconductor devices and vice versa.

In at least one embodiment, the process for producing the optoelectronic semiconductor devices comprises the following steps, in particular in the order indicated:

A) producing a carrier composite having a multiplicity of the carriers,

B) attaching and simultaneously electrically contacting the semiconductor chips to the carrier composite, and C) separating the carrier composite to form the semiconductor devices.

In the following, an optoelectronic semiconductor device described herein and a method described herein are explained in more detail with reference to the drawing on the basis of exemplary embodiments. Identical reference signs indicate identical elements in the individual figures. However, no references to scale are shown, rather individual elements may be shown exaggeratedly large for better understanding.

DETAILED DESCRIPTION OF ILLUSTRATIVE EMBODIMENTS

Figure 1:
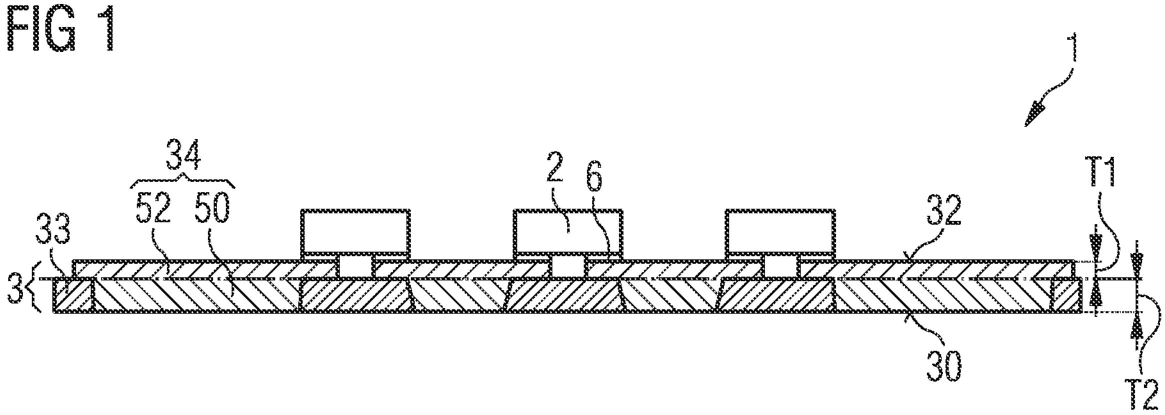
FIG. 1 is a schematic sectional view of an exemplary embodiment of an optoelectronic semiconductor device described herein.

FIG. 1 shows an embodiment of an optoelectronic semiconductor device 1. The semiconductor device 1 comprises a carrier 3 and a plurality of optoelectronic semiconductor chips 2, such as LED chips. The semiconductor chips 2 are attached to a mounting side 32 of the carrier 3, the mounting side 32 is remote from an attachment side 30. Optionally, the mounting side 32 and the attachment side 30 are oriented parallel to each other. The attachment side 30 is configured for surface mounting. The semiconductor chips 2 are electrically connected in series and attached to the carrier 3 by means of an electrical connection means 6, for example a solder.

The carrier 3 is composed of several separate lead frame parts 34 and a potting body 33, the potting body 33 mechanically connecting the lead frame parts 34. The lead frame parts 34 are, for example, etched copper pieces which may be produced from a common metal sheet. On the mounting side 32, the lead frame parts 34 protrude beyond the potting body 33, and on the attachment side 30, the lead frame parts 34 are optionally flush with the potting body 33.

The lead frame parts 34 are wider at the mounting side 32 and thus outside the potting body 33 than inside the potting body 33. A total thickness of the lead frame parts 34 is, for example, at least 30 μm and/or at most 500 μm. For example, the thickness of the lead frame parts 34 is equal to a thickness of the carrier 3.

Seen in cross-section, the areas of the lead frame parts 34 that are wider in the lateral direction each have a certain thickness T1. With this thickness T1, the lead frame parts 34 extend onto the potting body 33. A mounting layer 52 is defined on the mounting side 32 by these areas of the lead frame parts 34 with the thickness T1. The mounting layer 52 is thus composed of regions of a plurality of the separate lead frame parts 34, and is thus not a continuous layer. Accordingly, remaining portions of the lead frame parts 34 form a support layer 50 having a thickness T2. The thickness T2 of the support layer 50 is preferably also equal to a thickness of the potting body 33.

The thickness T2 is greater than the thickness T1. Due to the larger thickness T2, the support layer 50, together with the potting body 33, can mechanically support the carrier 3. In contrast, due to the smaller thickness T1, which is comparatively small, precise conductor structures can be realized from the lead frame parts 34 on the mounting side 32.

The thickness T1 of the mounting layer 52 is, for example, 35 μm +/−15 μm. The total thickness of the lead frame parts 34, that is, T1+T2, is for example 135 μm +/−15 μm. A distance between adjacent lead frame parts 34 at the mounting side 32 is, for example, about 70 μm or at most 70 μm. A distance between adjacent lead frame parts 34 on the attachment side 30, on the other hand, is, for example, at least 250 μm or at least 200 μm.

In this case, the lead frame parts 34 are preferably spaced from an outer outline of the carrier 3, so that the lead frame parts 34 then do not extend to outer sides of the semiconductor device 1. For example, a smallest distance between the outer surfaces and the lead frame parts 34 is at least 10 μm and/or at most 1 mm. That is, side surfaces and lateral dimensions of the semiconductor device 1 are preferably defined by the potting body 33, and not by the lead frame parts 34.

Figure 2:
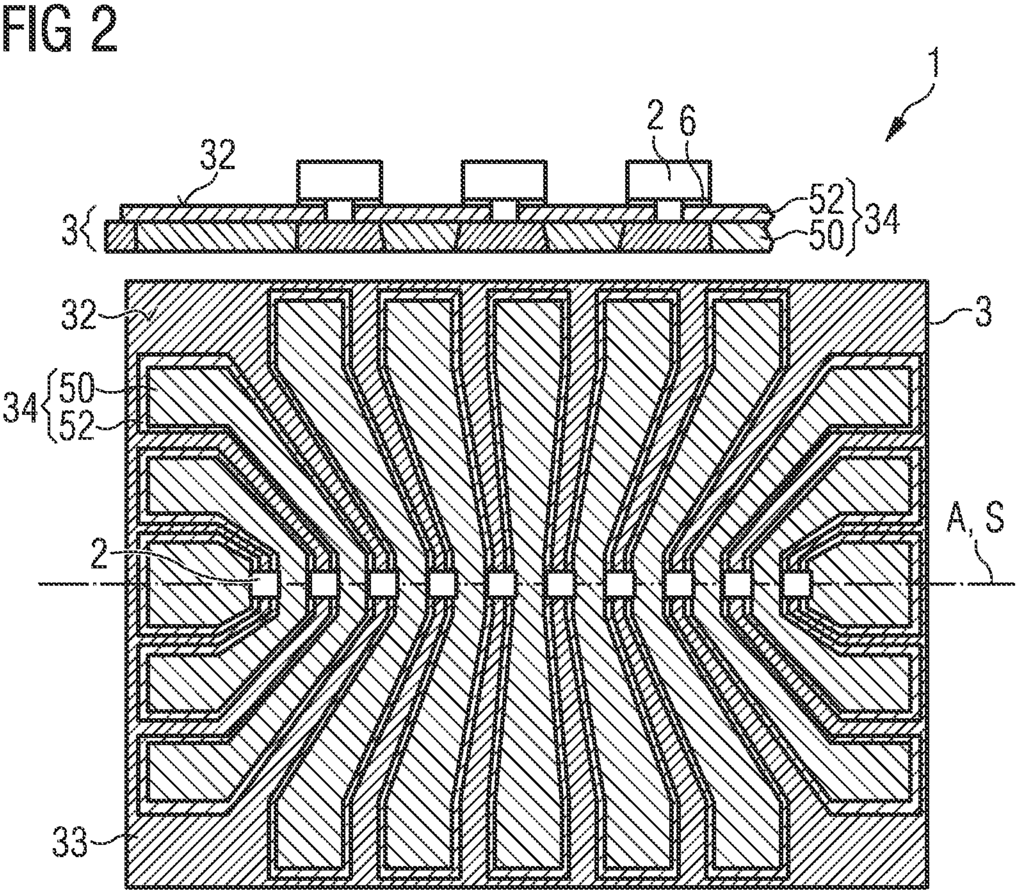
FIG. 2 is a schematic top view and a schematic sectional view of an exemplary embodiment of an optoelectronic semiconductor device described herein.

FIG. 2 shows a further exemplary embodiment. The sectional view in the upper part of FIG. 3 corresponds essentially to the view in FIG. 1. In the top view of FIG. 2, lower part of the figure, it can be seen that the mounting layer 52 completely covers the support layer 50 and protrudes laterally all around from the support layer 50. That is, the support layer 50 may be surrounded all around by an overhang of the mounting layer 52, as seen in plan view.

Furthermore, the semiconductor chips 2 connected in series are located on an arrangement line A, for example on a straight line section defining an axis S of mirror symmetry for a shape of the lead frame parts 34. The sectional view in the upper part of FIG. 2 is along this arrangement line A. In addition to the current conduction, an assembly marking which is not drawn and which breaks the mirror symmetry may be present, as is also possible in all other exemplary embodiments.

The lead frame parts 34 are arranged in a spider leg-like manner, for example. It is possible for the lead frame parts 34 to widen in the direction away from the mirror symmetry axis S; this applies at least to those lead frame parts 34 which run transversely to the mirror symmetry axis S and intersect the mirror symmetry axis S. The two lead frame parts 34 which have edges along the mirror symmetry axis S can widen towards the respective associated edge of the carrier 3. The central lead frame parts 34 along the mirror symmetry axis S may extend between two opposite sides of the carrier 3. In a transition region between the central lead frame parts 34 and the edge lead frame parts 34, the lead frame parts 34 may be U-shaped or V-shaped. The lead frame parts 34 may extend to the edge of the carrier 3 or terminate at a distance from this edge.

It is possible that, viewed from above, the semiconductor chips 2 are located only on areas of the lead frame parts 34 that are to be assigned to the mounting plane 52. This means that the semiconductor chips 2 and areas of the lead frame parts 34 which are to be assigned to the support plane 50 need not overlap.

In all other respects, the comments on FIG. 1 apply in the same way to FIG. 2, and vice versa.

Figure 3:
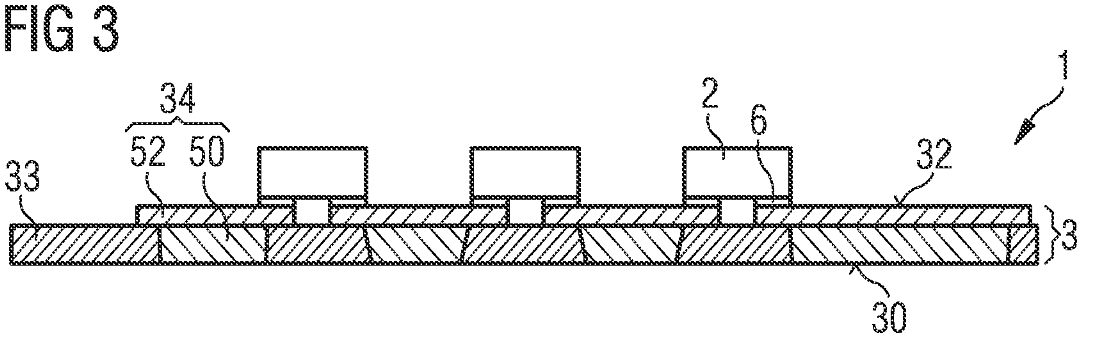
FIG. 3 is a schematic sectional view of an exemplary embodiment of an optoelectronic semiconductor device described here.
Figure 4:
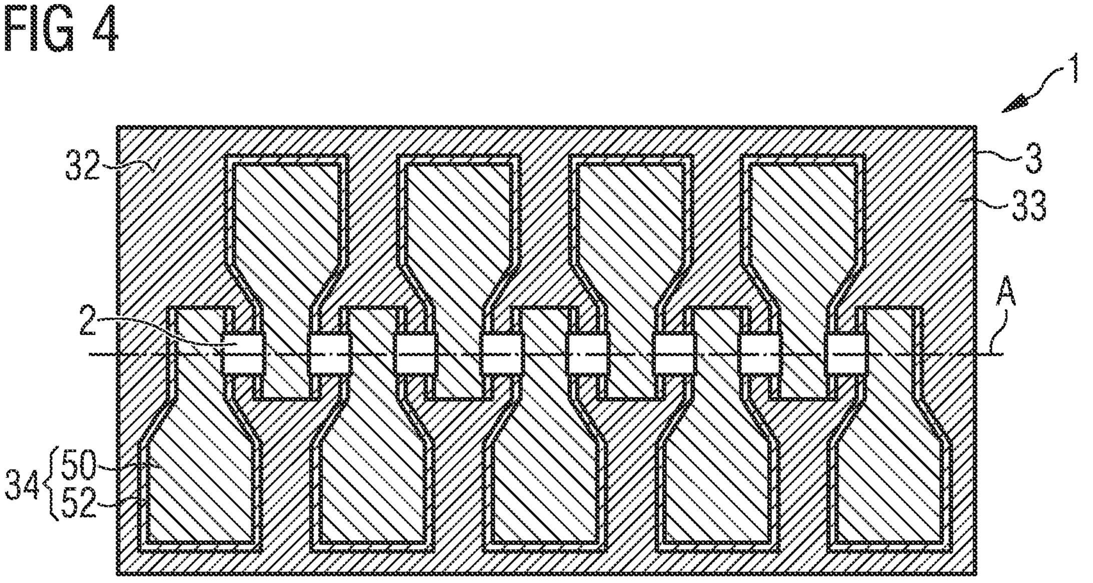
FIGS. 4 and 5 are schematic top views of the optoelectronic semiconductor device of FIG. 3.
Figure 5:
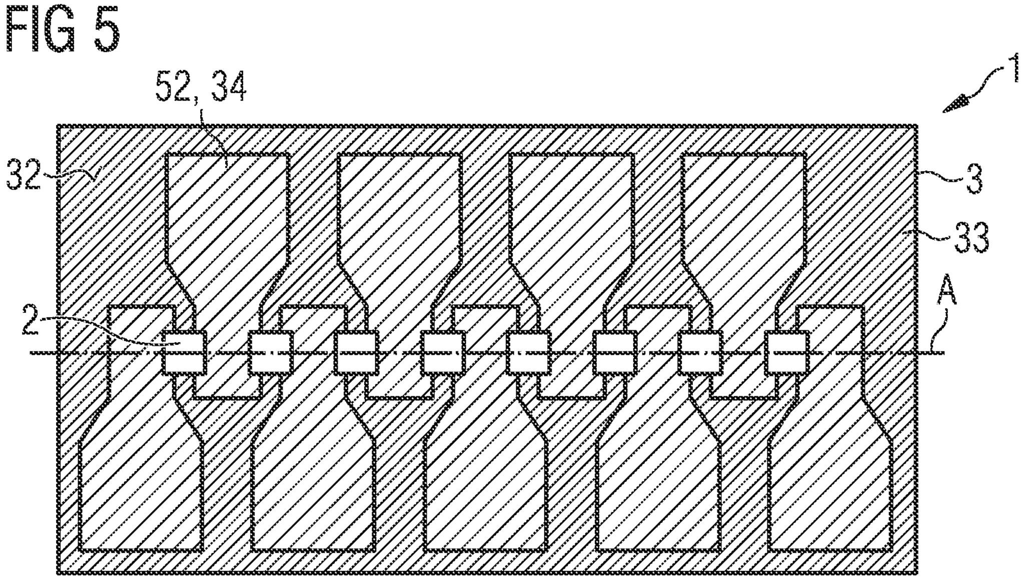

FIGS. 3 to 5 show another exemplary embodiment of the semiconductor device 1, wherein FIG. 4 shows the outlines of the areas of the lead frame parts 34 of the support plane 50 and FIG. 3 refers to a section along the arrangement line A. As above in FIG. 2, also according to FIGS. 3 to 5, the semiconductor chips 2 are connected in series and arranged along the arrangement line A. The arrangement line A may be a straight line section, but may also be curved. The lead frame parts 34 for the semiconductor chips 2 of the electrical series circuit are arranged along two rows, which run in particular parallel to the arrangement line A. The lead frame parts 34 for the semiconductor chips 2 of the electrical series circuit are arranged along two rows, which run in particular parallel to the arrangement line A. These rows interlock with each other so that the lead frame parts 34 of the two rows are alternately present along the arrangement line A.

For example, the lead frame parts 34 are each composed of two rectangles and an intervening connecting trapezoid, as seen in plan view, with the rectangles intersecting the arrangement line A being narrower in the direction parallel to the arrangement line A. Thus, the lead frame parts 34 can widen in the direction away from the arrangement line A. Widening preferably takes place in an area in which only the lead frame parts 34 of a single row are present in the direction parallel to the arrangement line A.

As in FIG. 2, the mounting layer 52 may completely cover the support layer 50 and project all around. The electrical connection means 6, such as solder contacts, are arranged along two edges of the semiconductor chips 2 and are essentially located only on the mounting layer 52, as seen in plan view.

For example, at least three or at least five of the semiconductor chips 2 are present. Alternatively or additionally, the number of semiconductor chips 2 is at most 128 or at most 64 or at most 32 or at most 16. This may also apply to all other embodiments.

In all other respects, the comments on FIGS. 1 and 2 apply in the same way to FIGS. 3 to 5, and vice versa.

In the semiconductor device 1 of FIGS. 6 to 9, the semiconductor chips 2 are electrically connected in parallel and optionally mounted again along the arrangement line A, which may be a straight line segment. The semiconductor chips 2 are all mounted in the same orientation. This means, for example, that in FIG. 7 all cathode connections of the semiconductor chips 2 are located on the right.

The lead frame parts 34 for the electrical parallel circuit are each comb-shaped, so that each of these lead frame parts 34 has a plurality of prongs 55. The prongs 55 run perpendicular to the arrangement line A and the respective lead frame parts 34 interlock in the region of the prongs 55. Each of the prongs 55 is associated with only exactly one of the semiconductor chips 2.

Figure 7:
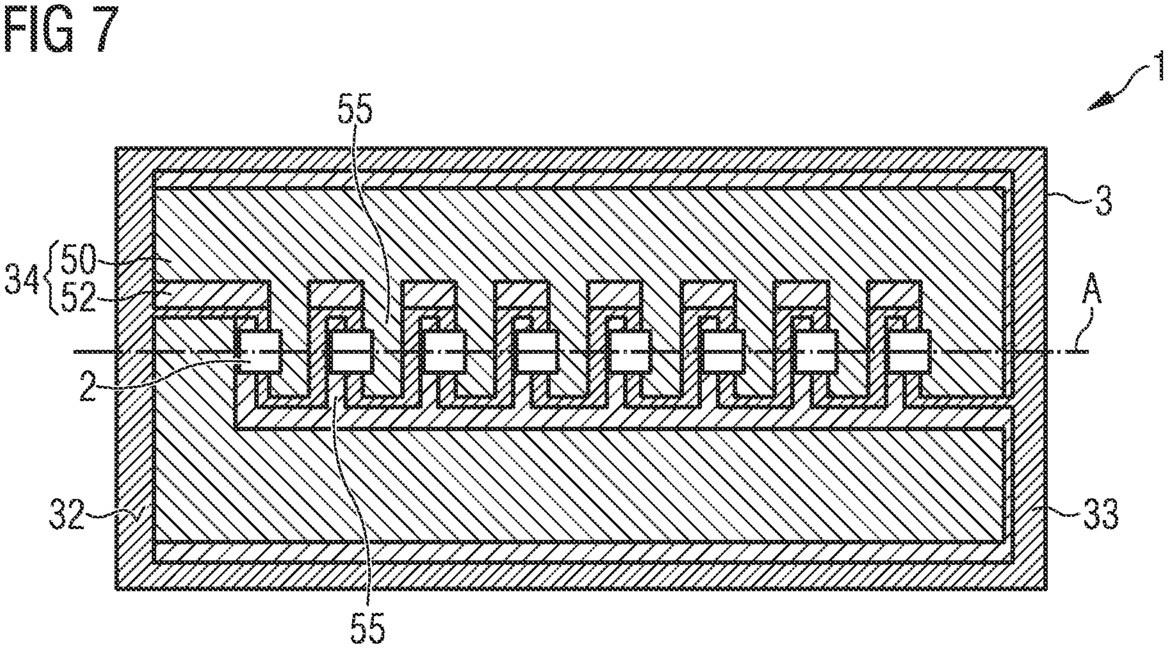
FIGS. 7 and 8 are schematic top views of the optoelectronic semiconductor device of FIG. 6.

In this context, the upper lead frame part 34 in FIG. 7 has prongs 55 which comprise both the support layer 50 and the mounting layer 52. In particular, in this lead frame part 34, the support layer 50 and the mounting layer 52 are congruent at the prongs 55, whereby the prongs 55, as seen in plan view, can optionally be connected at foot points of strips parallel to the arrangement line A only of the mounting layer 52. That is, in this lead frame parts 34, the prongs 55 are comparatively thick due to the presence of the support layer 50 and mounting layer 52.

In contrast, the prongs 55 of the lower lead frame part 34 in FIG. 7 are formed only by the mounting layer 52. This means that the prongs 55 of this lead frame part 34 float on the potting body 33. Because these lead frame parts 34 are relatively thin, the prongs 55 in question can move comparatively easily and cushion or absorb forces due to thermal expansion.

All areas of the lower lead frame part 34 facing the prongs 55 of the upper lead frame part 34 in FIG. 7 may have a mounting layer 52 projecting beyond the support layer 50. On outer sides of the lead frame parts 34, which face away from the arrangement line A and may run parallel to the arrangement line, it is also possible for the mounting layer 52 to project beyond the support layer 50.

Figure 6:
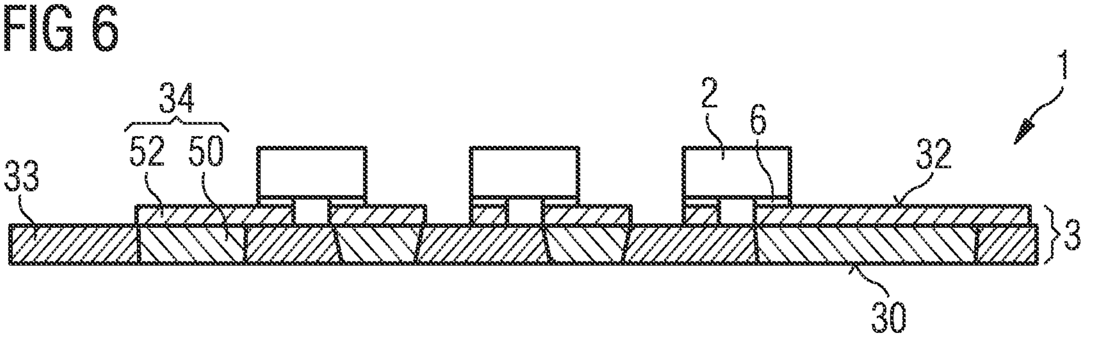
FIG. 6 is a schematic sectional view of an exemplary embodiment of an optoelectronic semiconductor device described herein.
Figure 8:
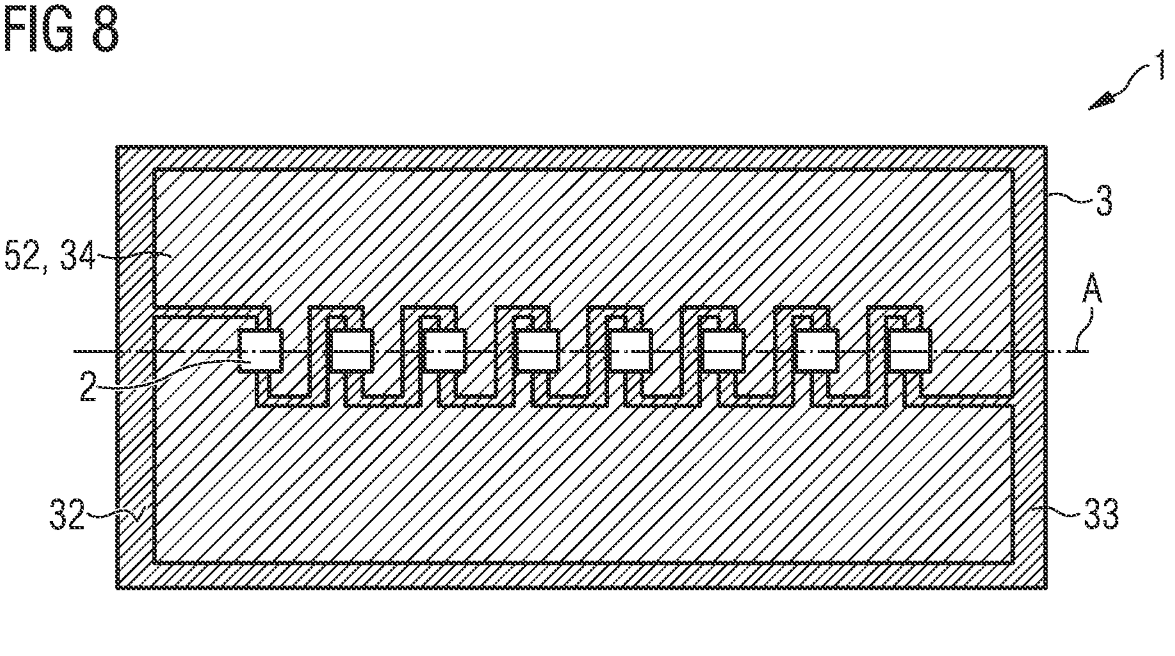

In all other respects, the comments on FIGS. 1 to 5 apply in the same way to FIGS. 6 to 8, and vice versa.

Figure 9:
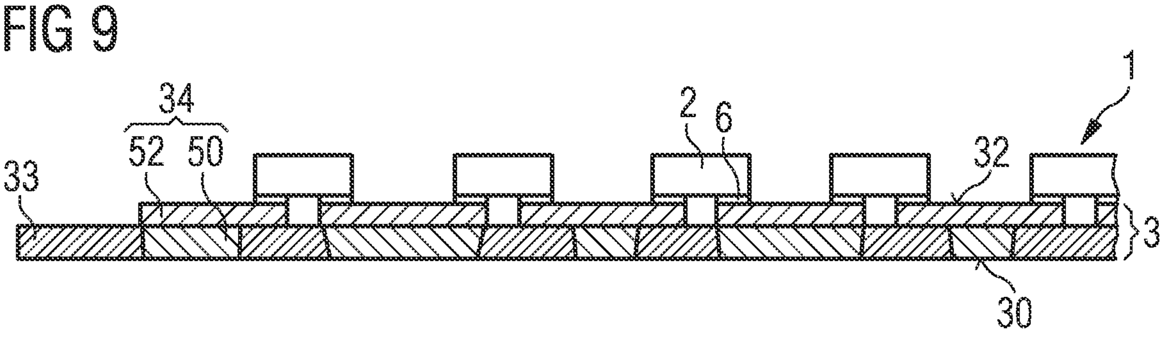
FIG. 9 is a schematic sectional view of an exemplary embodiment of an optoelectronic semiconductor device described herein.
Figure 10:
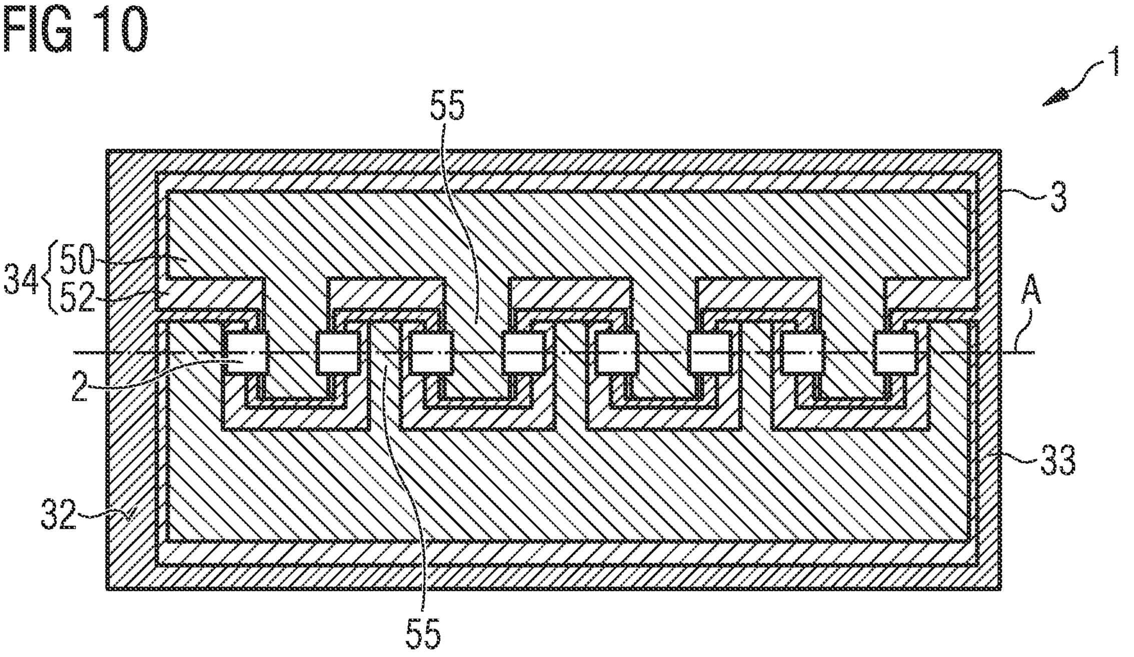
FIGS. 10 and 11 are schematic top views of the optoelectronic semiconductor device of FIG. 9.
Figure 11:
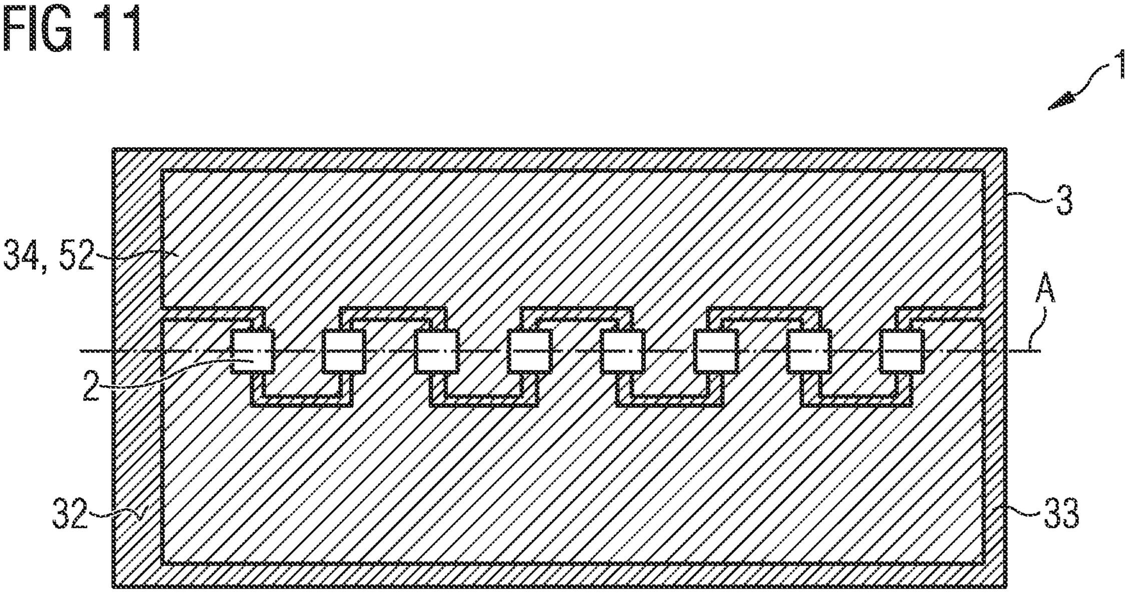

In the exemplary embodiment of FIGS. 9 to 11, the semiconductor chips 2 are also connected in parallel. Unlike in FIGS. 6 to 8, however, the semiconductor chips 2 are applied with alternating orientations, so that, for example, the cathodes of the semiconductor chips 2 are located alternately on the right and left. Thus, each prong 55 has two of the semiconductor chips 2 associated with it, which are oriented rotated 180° with respect to each other.

In the case of the prongs 55 of the upper lead frame part 34 in FIG. 10, the support layer 50 and the mounting layer 52 are arranged congruently. In the case of the lower lead frame part 34 in FIG. 10, the mounting layer 52 overlaps the support layer 50 only on the longitudinal sides of the prongs 55, the longitudinal sides being aligned perpendicular to arrangement line A. As in FIGS. 6 to 8, in FIGS. 9 to 11 one electrical contact area of the semiconductor chips 2 is thus preferably located only above the mounting layer 52 and a further electrical contact area is located both above the mounting layer 52 and above the support layer 50.

In all other respects, the comments on FIGS. 1 to 8 apply in the same way to FIGS. 9 to 11, and vice versa.

Figure 12:
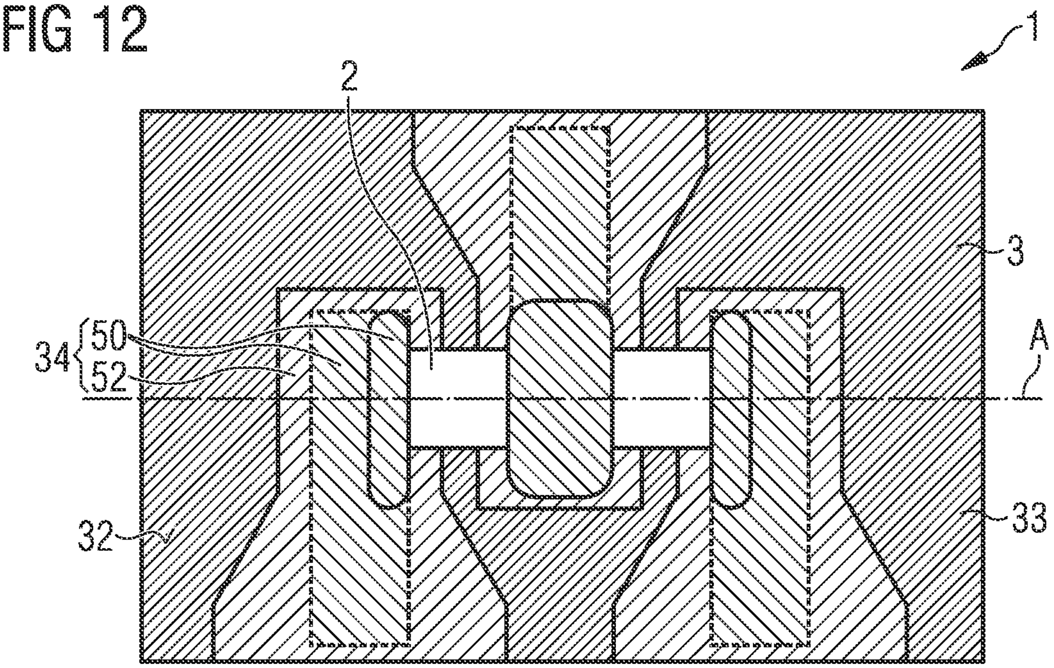
FIG. 12 is a schematic top view of an exemplary embodiment of an optoelectronic semiconductor device described herein.
Figure 13:
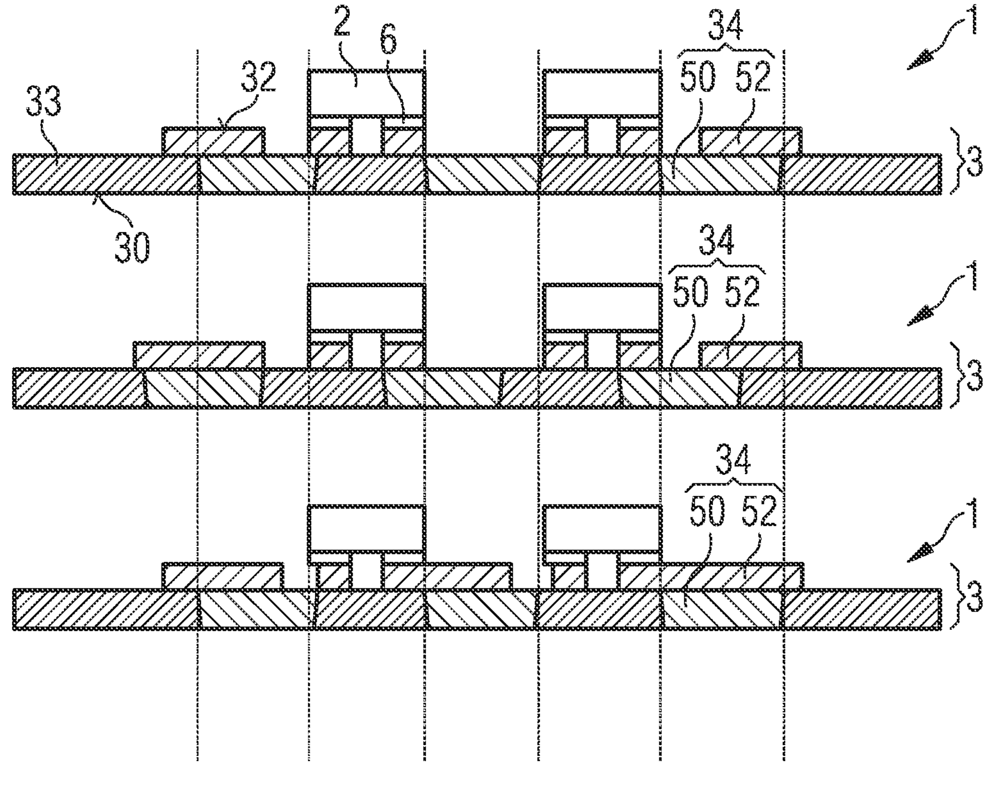
FIG. 13 shows several variants of schematic sectional views of the optoelectronic semiconductor device of FIG. 12.
Figure 14:
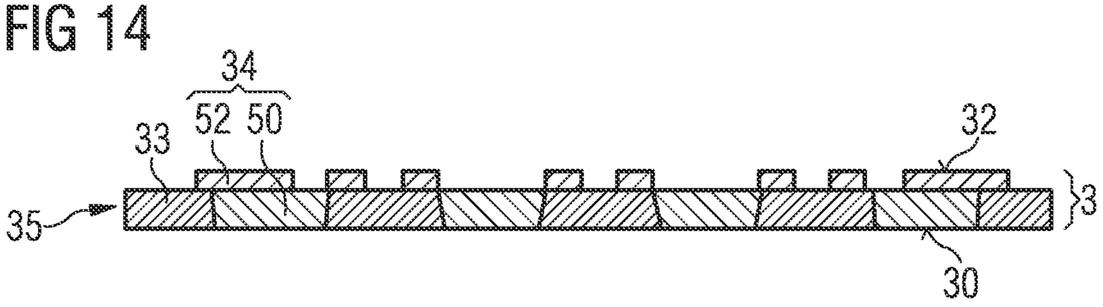
FIGS. 14 to 17 are schematic sectional views of process steps of an exemplary embodiment of a manufacturing process for embodiments of optoelectronic semiconductor devices described herein.

FIGS. 12 and 13 illustrate various design possibilities for a projection of the mounting layer 52 over the support layer 50. The series circuit of FIGS. 3 to 5 serves as an example as a basis for this, but the various design possibilities apply in the same way to the semiconductor devices 1 of FIGS. 2 and 6 to 11. The design possibilities shown in FIG. 13 relate to sections along the arrangement line A.

FIG. 12 shows that the assembly layer 52 only partially covers the support layer 50. This means that the support layer 50 is partially exposed towards the mounting side 32. This allows sufficient mechanical stability to be achieved on the one hand through comparatively large proportions of the lead frame parts 34 on the support layer, and on the other hand the mounting layer 52 is sufficiently mechanically flexible to absorb thermal stress.

According to FIG. 12 and FIG. 13, upper part of the figure, the semiconductor chips 2 are located only above the mounting layer 52 and not above the supporting layer 50. Seen in cross-section, the mounting layer 52 and the supporting layer 50 are laterally offset so that the mounting layer 52 and the supporting layer 50 touch each other along the arrangement line A in the area of the semiconductor chips 2, but do not overlap or do not overlap significantly. The electrical contact areas of the semiconductor chips 2 and the associated areas of the layers 50, 52 are thus arranged symmetrically to each other.

In the variant of FIG. 13, middle part of the figure, the electrical contact surfaces of the semiconductor chips 2 are arranged symmetrically with respect to the mounting layer 52, but asymmetrically with respect to the supporting layer 50. That is, the mounting layer 52 under one of the electrical contact surfaces of the semiconductor chip 2 in question floats completely on the potting body 33, while the other of the electrical contact surfaces rests on both layers 50, 52. This makes it possible to achieve low thermal resistance toward an external mounting platform for the semiconductor device 1, not shown.

In the variant of FIG. 13, lower part of the figure, the mounting layer 52 is shaped asymmetrically with respect to the electrical contact areas of the semiconductor chips 2. That is, one of the electrical contact areas on one side of the semiconductor chips 2 is narrower than the associated area of the mounting layer 52, whereas the other electrical contact area is mounted congruently with the associated mounting layer 52, as seen in section along the arrangement line A. Thus, the semiconductor chips 2 are again located only above the mounting layer 52, with improved heat dissipation made possible by the close support layer 50 on one electrical contact surface each.

In all other respects, the comments on FIGS. 1 to 11 apply in the same way to FIGS. 12 and 13, and vice versa.

FIGS. 14 to 17 show a manufacturing process for semiconductor devices 1. According to FIG. 14, the carrier 3 is provided, and many of the carriers 3 may be integrated in a carrier composite 35.

In the figures, the individual areas of the lead frame parts 34 are rectangular or trapezoidal when viewed in cross-section to simplify the illustration. Due to etching processes, however, the lead frame parts 34 can also have rounded side surfaces when viewed in cross-section.

Figure 15:
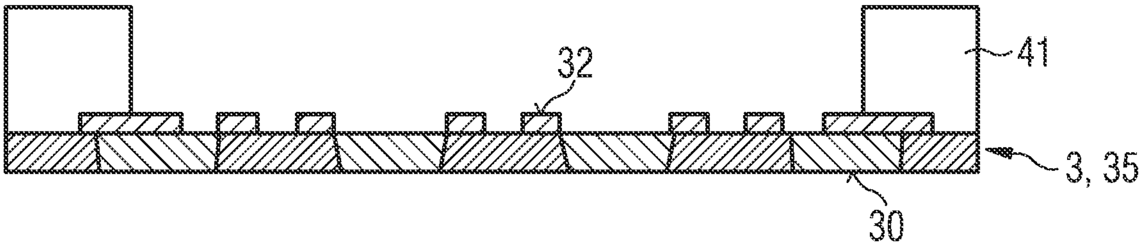

In FIG. 15, it is shown as an option that a housing ring 41 is attached to the carrier 3, for example by means of injection molding and/or pressing. The housing ring 41 is made of a white plastic, for example.

Figure 16:
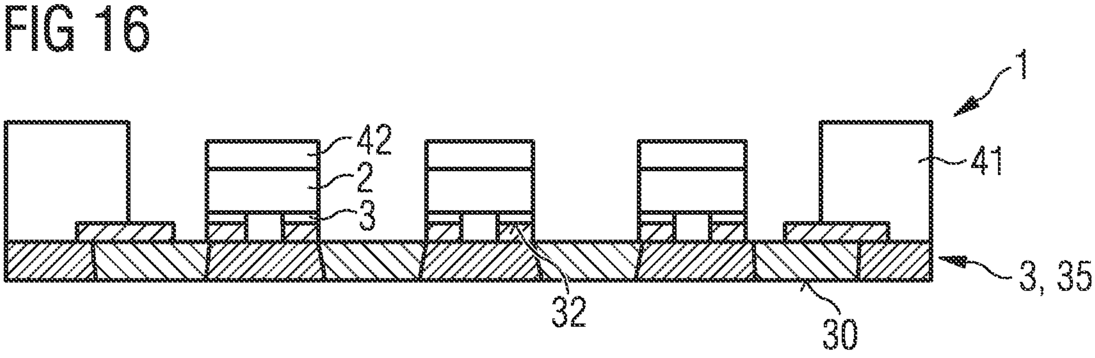

According to FIG. 16, the semiconductor chips 2 are applied to the mounting side 32. Optionally, the semiconductor chips 2 are each provided with a phosphor 42, for example a phosphor-containing silicone platelet or ceramic platelet. Preferably, the housing ring 41 protrudes over the phosphor bodies 42.

Figure 17:
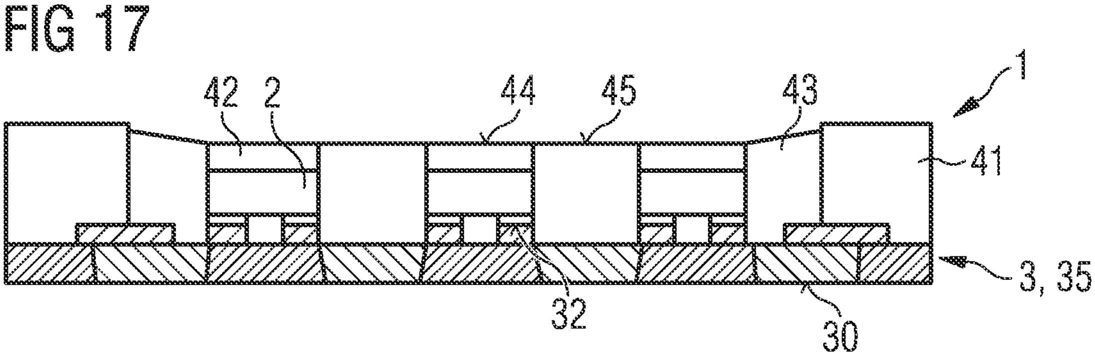

Finally, FIG. 17 illustrates that an encapsulation body 43 is optionally created. The encapsulation body 43 is, for example, made of a light-transmissive plastic, and the encapsulation body 43 may be transparent or milky cloudy. As an alternative to phosphor bodies 42 on the semiconductor chips 2, a phosphor may be added to the encapsulation body 43.

Preferably, upper surfaces 44 of the phosphor bodies 42 remain free of the encapsulation body 43. An upper surface 45 of the encapsulation body 43 may be concave when viewed as a whole.

In a further process step, not shown, the semiconductor devices 1 can be singulated through the housing ring 41 and the carrier composite 35, for example by sawing. Such singulation preferably takes place exclusively through the optional housing ring 41 and through potting bodies 33, so that the lead frame parts 34 themselves need not be affected by the singulation. Side surfaces of the semiconductor devices 1 can thus be free of the lead frame parts 34.

In all other respects, the comments on FIGS. 1 to 13 apply in the same way to FIGS. 14 to 17, and vice versa.

Figure 18:
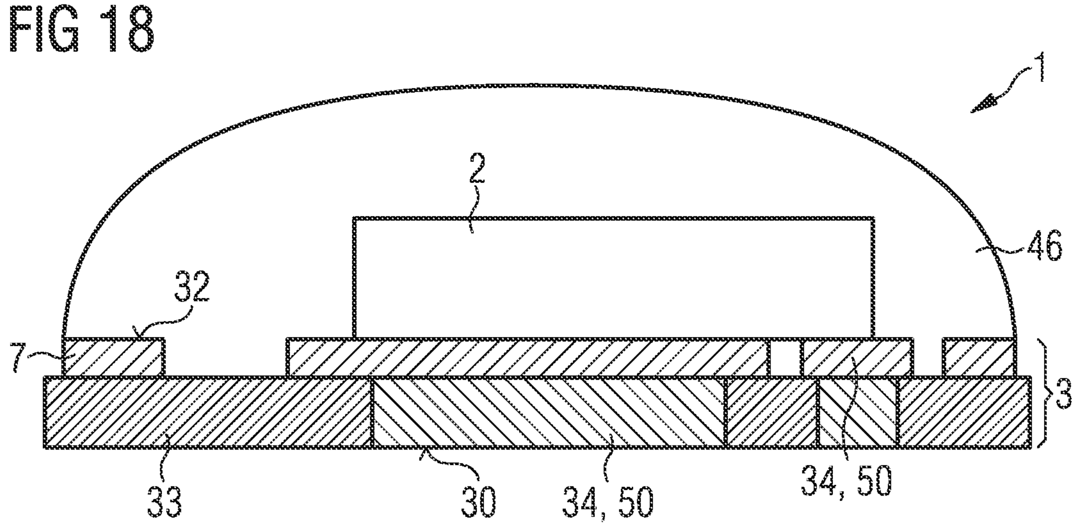
FIG. 18 is a schematic sectional view of an exemplary embodiment of an optoelectronic semiconductor device described herein.

Finally, FIG. 18 illustrates that the carrier 3 may have at least one further lead frame part 7. In FIG. 18, several of the semiconductor chips 2 may be arranged one behind the other in a direction perpendicular to the drawing plane, so that only one of the semiconductor chips 2 is visible in FIG. 18.

For example, the further lead frame part 7 is to be assigned to the mounting layer 52. According to FIG. 18, the further lead frame part 7 is designed as a ring on the potting body 33 and serves in particular as a stop edge when creating optics 46. The further lead frame part 7 may be electrically functionless. It is possible that the further lead frame part 7 has no connection to the support layer 50.

In all other respects, the comments on FIGS. 1 to 13 apply in the same way to FIGS. 14 to 17, and vice versa.

One or more of such further lead frame members 7 and/or optics 46 and/or an encapsulation body 43 and/or phosphor body 42 and/or a housing ring 41 may also be present in all other embodiments, individually or in any combination.

FIGS. 14 to 18 each show only semiconductor devices 1 with a single electrical series circuit or parallel circuit. Deviating from this, the semiconductor devices 1 can also have several series circuits and/or parallel circuits, also in combination with each other.

The components shown in the figures preferably follow one another in the sequence indicated, in particular directly one after the other, unless otherwise described. Components not touching each other in the figures are preferably spaced apart. Insofar as lines are drawn parallel to one another, the associated surfaces are preferably likewise aligned parallel to one another. Furthermore, the relative positions of the drawn components to each other are correctly reproduced in the figures, unless otherwise specified.

The invention described herein is not limited by the description based on the embodiments. Rather, the invention encompasses any new feature as well as any combination of features, which in particular includes any combination of features in the patent claims, even if this feature or combination itself is not explicitly stated in the patent claims or embodiments.

The invention claimed is:

1. An optoelectronic semiconductor device comprising:
a carrier comprising:
a mounting side and an attachment side opposite the mounting side, wherein the attachment side is configured for surface mounting of the semiconductor device;
a plurality of separate, metallic lead frame parts; and
a potting body mechanically holding together the lead frame parts; and
a plurality of optoelectronic semiconductor chips mounted on the mounting side,
wherein the lead frame parts project beyond the potting body at the mounting side,
wherein the optoelectronic semiconductor chips are flip-chips so that each one of the optoelectronic semiconductor chips is mounted on at least two of the lead frame parts and is electrically contacted by the lead frame parts,
wherein at least some of the lead frame parts have a double-layered design so that the lead frame parts together form a support layer on the attachment side and a mounting layer on the mounting side,
wherein the support layer is embedded in the potting body and the mounting layer is not, the mounting layer extending at least partially onto the potting body, and
wherein the support layer is thicker than the mounting layer by at least a factor of 2 and, as seen in plan view of the mounting side, the support layer is partially exposed, and/or the support layer terminates flush with the potting body in a direction towards the mounting side and towards the attachment side so that the potting body is as thick as the support layer.

2. The optoelectronic semiconductor device according to claim 1, wherein at least two-layered lead frame parts are formed in one piece so that the support layer and the mounting layer are made of the same material and are connected to one another without any joints.

3. The optoelectronic semiconductor device according to claim 1, wherein the lead frame parts are in each case copper pieces, and for at least one or all of the lead frame parts, which are of a two-layer design, the mounting layer in each case completely covers an associated supporting layer and projects laterally all around over said supporting layer.

4. The optoelectronic semiconductor device according to claim 1,
wherein the semiconductor chips are mounted only on the mounting layer,
wherein, viewed in plan view on the mounting side, each of the semiconductor chips extends at most 20% onto the support layer so that the semiconductor chips extend predominantly only onto the potting body and onto the mounting layer.

5. The optoelectronic semiconductor device according to claim 1, wherein, in at least one cross-section perpendicular to the mounting side and viewed through at least two of the semiconductor chips, at least some contiguous sub-regions of the mounting layer are spaced apart from the support layer so that the mounting layer is laterally displaced relative to the support layer as viewed in plan view on the mounting side.

6. The optoelectronic semiconductor device according to claim 1, wherein a minimum distance between adjacent lead frame parts at the mounting side is at most 70 μm.

7. The optoelectronic semiconductor device according to claim 1, wherein at least some of the semiconductor chips are connected to form an electrical series circuit.

8. The optoelectronic semiconductor device according to claim 7,
wherein the semiconductor chips of the electrical series circuit are arranged along a straight line section and the straight line section, viewed in plan view on the mounting side, forms an axis of mirror symmetry for the lead frame parts,
wherein, viewed in plan view on the mounting side, at least some of the lead frame parts widen in a direction away from the axis of mirror symmetry.

9. The optoelectronic semiconductor device according to claim 7, wherein the lead frame parts for the semiconductor chips of the electrical series circuit are arranged along two rows and these rows are only partially interdigitated so that the lead frame parts of these two rows are alternately present along an arrangement line of the semiconductor chips of the electrical series circuit.

10. The optoelectronic semiconductor device according to claim 1, wherein at least some of the semiconductor chips are connected to form an electrical parallel circuit.

11. The optoelectronic semiconductor device according to claim 10,
wherein the lead frame parts for the electrical parallel connection are each comb-shaped, so that each of the lead frame parts has a plurality of prongs, and
wherein the lead frame parts interlock with each other.

12. The optoelectronic semiconductor device according to claim 11, wherein the prongs of the lead frame parts for the electrical parallel connection each contact exactly one of the semiconductor chips.

13. The optoelectronic semiconductor device according to claim 11, wherein the prongs of the lead frame parts for the electrical parallel connection each contact exactly two of the semiconductor chips.

14. The optoelectronic semiconductor device according to claim 1, further comprising:
a housing ring made of plastic,
wherein the housing ring is mounted on the mounting side and forms a well in which the semiconductor chips are located.

15. An optoelectronic semiconductor device comprising:
a carrier; and
a plurality of optoelectronic semiconductor chips mounted on a mounting side of the carrier,
wherein the carrier comprises a plurality of separate, metallic lead frame parts and a potting body holding the lead frame parts together,
wherein an attachment side of the carrier is opposite the mounting side and the attachment side is configured for surface mounting of the semiconductor device,
wherein the lead frame parts project beyond the potting body at the mounting side,
wherein the optoelectronic semiconductor chips are flip chips so that each of the optoelectronic semiconductor chips is mounted on at least two of the lead frame parts and is electrically contacted by these lead frame parts,
wherein at least some of the lead frame parts have a double-layered design so that the lead frame parts together form a support layer on the attachment side and a mounting layer on the mounting side,
wherein the support layer is embedded in the potting body and the mounting layer is not, the mounting layer extending at least partially onto the potting body, and
wherein the support layer is thicker than the mounting layer by at least a factor of 2 and, as seen in plan view of the mounting side, the support layer is partially exposed.

16. The optoelectronic semiconductor device according to claim 1, wherein the optoelectronic semiconductor chips are attached to the carrier by electrical connections, and wherein the electrical connections are limited to the mounting layer, seen in plan view of the attachment side.

17. An optoelectronic semiconductor device comprising:

a carrier; and a plurality of optoelectronic semiconductor chips mounted on a mounting side of the carrier, wherein the carrier comprises a plurality of separate, metallic lead frame parts and a potting body holding the lead frame parts together, wherein an attachment side of the carrier is opposite the mounting side and the attachment side is configured for surface mounting of the semiconductor device, wherein the lead frame parts project beyond the potting body at the mounting side, wherein the optoelectronic semiconductor chips are flip chips so that each of the optoelectronic semiconductor chips is mounted on at least two of the lead frame parts and is electrically contacted by these lead frame parts, wherein at least some of the lead frame parts have a double-layered design so that the lead frame parts together form a support layer on the attachment side and a mounting layer on the mounting side, wherein the support layer is embedded in the potting body and the mounting layer is not, the mounting layer extending at least partially onto the potting body, and wherein the support layer terminates flush with the potting body in a direction towards the mounting side and towards the attachment side so that the potting body is as thick as the support layer.

18. The optoelectronic semiconductor device according to claim 17, wherein the lead frame parts are in each case copper pieces, and for all of the lead frame parts, which are of a two-layer design, the mounting layer in each case completely covers an associated one of the supporting layers and projects laterally all around beyond the supporting layer.

* * * * *